United States Patent [19]
Nardozza

[11] Patent Number: 5,376,880
[45] Date of Patent: Dec. 27, 1994

[54] METHOD AND APPARATUS FOR MEASURING THE AVERAGE POWER IN AN ELECTRIC SIGNAL

[75] Inventor: Gregg S. Nardozza, Hardyston Township, Sussex County, N.J.

[73] Assignee: AT&T Corp., Murray Hill, N.J.

[21] Appl. No.: 40,334

[22] Filed: Mar. 30, 1993

[51] Int. Cl.$^5$ .................. G01R 23/04; G01R 5/26
[52] U.S. Cl. ..................................... 324/106; 324/95
[58] Field of Search ............... 324/106, 706, 725, 95; 374/33, 114, 178; 363/13, 174

[56] References Cited

U.S. PATENT DOCUMENTS

| | | | |
|---|---|---|---|
| 3,399,348 | 8/1968 | Praglin et al. | 324/106 |
| 3,435,319 | 3/1969 | Richman | 324/106 |
| 4,023,099 | 5/1971 | Van Kessel et al. | 324/106 |

Primary Examiner—Vinh Nguyen
Attorney, Agent, or Firm—Jason P. DeMont

[57] ABSTRACT

An apparatus is disclosed which accurately measures, over a wide ambient temperature range, the average power derived from an electrical signal. Furthermore, embodiments of the present invention can be fabricated with inexpensive, off-the-shelf components and can have excellent circuit characteristics at RF frequencies. These results are obtained in an illustrative embodiment of the present invention that comprises a first thermal detector, a second thermal detector, an error amplifier and a summer. The first thermal detector provides a reference signal, which varies with the ambient temperature, to the error amplifier. The summer receives the signal to be measured and the signal output from the error amplifier, and outputs to the second thermal detector a composite signal, which is indicative of the sum of the power derived from input signal and the output signal from the error amplifier. The second thermal detector receives the composite signal and outputs a feedback signal, which is indicative of power derived from the composite signal, to the error amplifier. The output signal, which is indicative of the power derived from the input signal, is the output of the error amplifier. The error amplifier advantageously subtracts the feedback signal from the reference signal, and advantageously outputs the amplified difference to the summer.

10 Claims, 2 Drawing Sheets

METHOD AND APPARATUS FOR MEASURING THE AVERAGE POWER IN AN ELECTRIC SIGNAL

FIELD OF THE INVENTION

The present invention relates to electric circuit design in general, and more particularly, to methods and apparatus which measure the average power derived from an electric signal.

BACKGROUND OF THE INVENTION

It is often necessary to measure the average, in contrast to peak power of a given signal. Typically, this has been accomplished for alternating-current ("AC") signals, especially at radio-frequencies, with a diode detector circuit. In a diode detector circuit the signal whose power is to be measured is placed across a diode while the diode is biased to be in its "square-law" region. As long as the oscillations from the signal do not drive the dime out of the square-law region, the voltage across the diode is indicative (e.g., proportional) of the power derived from the signal. When, however, the signal to be measured is complex (i.e., has multiple sinusoidal components) the respective sinusoidal components can constructively interfere, thus pushing the diode out of the square-law region and rendering the circuit inaccurate. Furthermore, the diode detector circuit has the disadvantage that the accuracy with which the circuit can measure the power derived from the signal deteriorates with changes in the ambient temperature.

SUMMARY OF THE INVENTION

Embodiments of the present invention are capable of measuring the power derived from a signal, whether that signal is a direct-current "DC" signal or an alternating-current "AC" signal, while avoiding many of the costs and restrictions associated with prior methods. Specifically, embodiments of the present invention may enjoy one or more of the following advantages. First, the precision with which embodiments of the present invention can measure the power derived from a signal is invariant with respect to changes in ambient temperature. Second, the precision of embodiments of the present invention is unaffected by the presence or absence of complex signals. Third, embodiments of the present invention can be fabricated from inexpensive and readily available circuit elements, and lastly, embodiments of the present invention can have excellent circuit characteristics at radio-frequencies ("RF").

These results are obtained in an illustrative embodiment of the present invention that comprises a first thermal detector, a second thermal detector, an error amplifier and a summer. The first thermal detector provides a reference signal to the error amplifier. The summer receives the input signal to be measured and the signal output from the error amplifier, and feeds to the second thermal detector a composite signal, which is indicative of the sum of the power derived from the input signal and the output signal from the error amplifier. The second thermal detector receives the composite signal and outputs a feedback signal, which is indicative of power in the composite signal, to the error amplifier. The output signal, which is indicative of the power in the input signal, is the output of the error amplifier. The error amplifier subtracts the feedback signal from the reference signal, and advantageously outputs the amplified difference to the summer.

DETAILED DESCRIPTION

Figure 1:
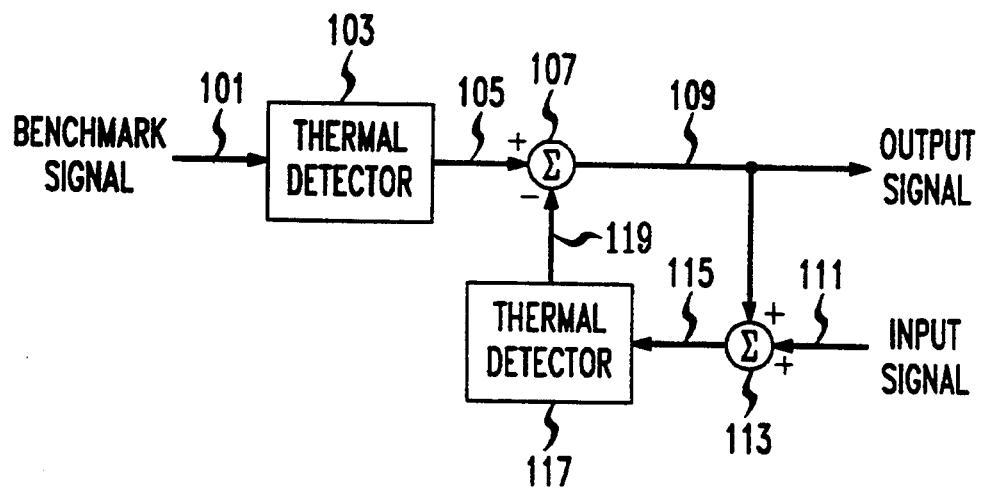
FIG. 1 shows a block diagram of an illustrative embodiment of the present invention.

The illustrative embodiment shown in FIG. 1 advantageously comprises thermal detector 103, error amplifier 107, summer 113 and thermal detector 117. Thermal detector 103 receives a "benchmark signal" on lead 101. It is preferred that the root-mean-squared "RMS") value of the benchmark signal be invariant with respect to temperature during the interval in which the input signal's power is measured. The benchmark signal is advantageously DC, but it will be clear to those of ordinary skill in the art how to make and use embodiments of the present invention where the signal is AC.

Thermal detector 103 generates a "reference signal" on lead 105 that is indicative of the power derived from the benchmark signal and that is modulated by the ambient temperature. The reference signal on lead 105 is fed into error amplifier 107, which is described infra.

Thermal detector 117 receives a "composite signal" on lead 115 and produces a "feedback signal" on lead 119 that is indicative of the power derived from the composite signal and that is modulated by the ambient temperature. The origin of the composite signal is described infra. It is preferred that thermal detector 117 modulate the feedback signal, with respect to changes in the ambient temperature, in precisely the same manner that thermal detector 103 modulates the reference signal, with respect to changes in the ambient temperature. Thermal detector 117 feeds the feedback signal into error amplifier 107.

Error amplifier 107 receives the reference signal on lead 105 and the feedback signal on lead 119 and generates an "output signal" on lead 109. The output signal is important in that it is indicative of the average power derived from the signal whose power is to be measured. Error amplifier 107 advantageously generates the output signal by subtracting the feedback signal from the reference signal and by amplifying the difference. So that the embodiment operates as precisely as possible, it is preferred that the gain of error amplifier 107 be as high as practical. It will be clear to those of ordinary skill how to fabricate error amplifier 107 from readily available components. The output signal on lead 109 is the ultimate product of the illustrative embodiment and is also fed into summer 113.

Summer 113 receives the output signal on lead 109 and an "input signal" on lead 111, and produces the composite signal on lead 115 that is fed into thermal detector 117. The input signal is the signal whose power is to be measured by the illustrative embodiment and may be either AC or DC. The composite signal on lead 115 is advantageously generated by adding the output signal on lead 109 and the input signal on lead 111. It is preferred that the range of the feedback signal on lead 119, due to fluctuations in the input signal on lead 111, not exceed the absolute value of the reference signal on lead 105.

Figure 2:
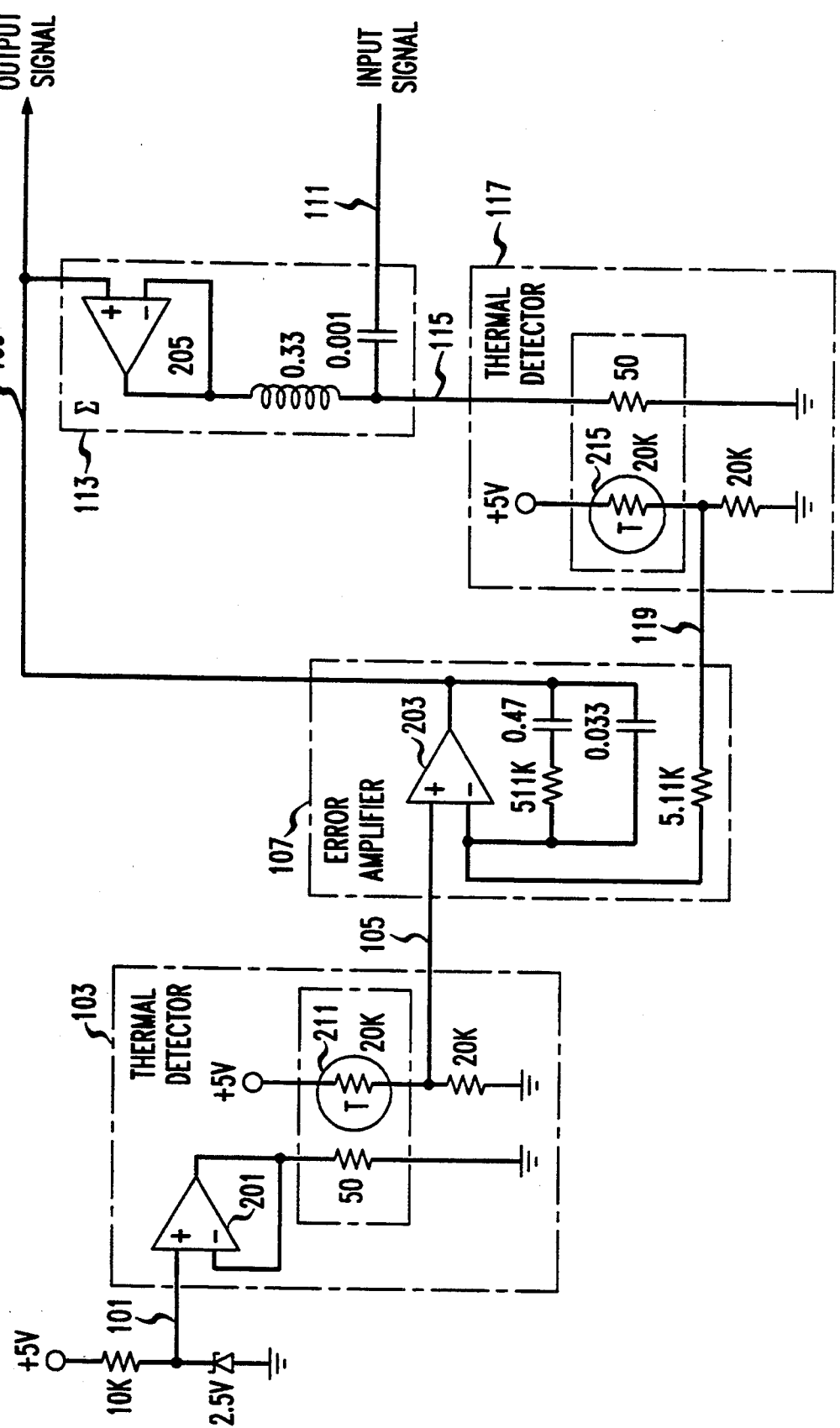
FIG. 2 depicts a schematic diagram of the illustrative embodiment shown in FIG. 1.

Referring to FIG. 2, the benchmark signal on lead 101 is preferably derived from a temperature stable DC voltage reference (e.g., a resistor/diode pair). For the purposes of this description all resistor values are in Ohms, all capacitor values are in micro-Farads, and all inductor values are in micro-Henrys. First thermal detector 103 advantageously buffers the benchmark signal with operational amplifier 201 and uses the buffered signal to drive a radiator, such as a 50 ohm resistor. It is preferred that the power dissipated in the 50 ohm resistor be invariant with respect to ambient temperature and constant over time. It is also preferred that thermistor 211 receive at least some of the energy radiated by the 50 ohm resistor and modulate the reference signal on lead 105 based on both the ambient temperature and on the amount of energy radiated by the 50 ohm resistor in thermal detector 103. Thermistor 211 preferably has a negative temperature coefficient. It will be clear to those skilled in the art that either or both of thermistor 211 and thermistor 215 can be replaced with other temperature sensitive transducers (e.g., thermocouples, temperature sensing integrated circuits, semiconductor diodes, etc.)

Error amplifier 107 receives the reference signal on lead 105 and feeds it into the non-inverting input of operational amplifier 203. Error amplifier 107 also receives the feedback signal from lead 119 and feeds it through a 5.11K ohm resistor into the inverting input of operational amplifier 203. Operational amplifier 203 has associated with it a 511K ohm resistor and two capacitors that stabilize the embodiment. It will be clear to those of ordinary skill that the values of the resistive and capacitive components in any given embodiment depend primarily upon the thermal transfer characteristics of thermistor 215 and the 50 ohm resistor associated with it in thermal detector 117. The output of operational amplifier 203 is the output signal on lead 109, which varies inversely with respect to the power derived from the input signal.

Summer 113 receives the output signal on lead 109 and buffers it with operational amplifier 205. Summer 113 also receives the input signal on lead 111 and feeds it through a capacitor and onto lead 115. The output of operational amplifier 205 is fed through an inductor where it is added to the input signal to create the composite signal on lead 115. The capacitor and inductor in summer 113 are used when the input signal is AC. It will be clear to those of ordinary skill that the capacitor and inductor in summer 113 should be replaced with resistors when the input signal is DC.

Thermal detector 117 receives the composite signal on lead 115 that drives a 50 ohm resistor associated with thermistor 215. Thermistor 215 preferably receives at least some of the energy radiated by the 50 ohm resistor and modulates the feedback signal on lead 1 19 based on both the ambient temperature and on the amount of energy radiated by the 50 ohm resistor. Thermistor 215 preferably has the same electrical and thermal characteristics as thermistor 211.

What is claimed is:

1. An apparatus for producing an output signal that is indicative of the power drawn from an input signal, said apparatus comprising:
   (1) a first thermal detector (103) for providing a reference signal, said first thermal detector (103) comprising:
      (a) a first thermal radiator for receiving a benchmark signal and for radiating a quantity of heat energy that is drawn from said benchmark signal, and
      (b) a first thermal sensor for receiving at least some of the energy radiated by said first thermal radiator and for creating said reference signal based on the quantity of energy received from said first thermal radiator;
   (2) a second thermal detector (117) for providing a feedback signal, said second thermal detector (117) comprising:
      (a) a second thermal radiator for receiving a composite signal and for radiating a quantity of heat energy that is drawn from said composite signal, and
      (b) a second thermal sensor for receiving at least some of the energy radiated by said second thermal radiator and for creating said feedback signal based on the quantity of energy received from said second thermal radiator;
   (3) first means (107) for producing said output signal, said output signal being indicative of the difference of said reference signal minus said feedback signal; and
   (4) second means (113) for producing said composite signal, said composite signal being indicative of the sum of said output signal and said input signal.

2. The apparatus of claim 1 wherein said first thermal radiator comprises a resistor and said second thermal radiator comprises a resistor.

3. The apparatus of claim 1 wherein said first thermal sensor (103) comprises a first thermistor and wherein said second thermal sensor (113) comprises a second thermistor.

4. The apparatus of claim 1 wherein said output signal varies proportionally with respect to the power produced by said input signal.

5. The apparatus of claim 1 wherein said output signal is the amplified difference of said reference signal minus said feedback signal.

6. A method for producing an output signal that is indicative of the power derived from an input signal, said method comprising the steps of:
   (1) in a first thermal detector (103),
      (a) radiating, with a first thermal radiator, a quantity of heat energy that is drawn from a benchmark signal,
      (b) receiving with a first thermal sensor at least some of the energy radiated by said first thermal radiator, and
      (c) creating a reference signal based upon the ambient temperature and the amount of energy received from said first thermal radiator;
   (2) in a second thermal detector (117),
      (a) radiating, with a second thermal radiator, a quantity of heat energy that is drawn from a composite signal,
      (b) receiving with a second thermal sensor at least some of the energy radiated by said second thermal radiator, and
      (c) creating a feedback signal based upon the ambient temperature and the amount of energy received from said second thermal radiator;
   (3) in an error detector (107), producing said output signal, said output signal being indicative of the difference of said reference signal minus said feedback signal; and
   (4) in a summer (113), producing said composite signal, said composite signal being indicative of the sum of said output signal and said input signal.

7. The method of claim 6 wherein said first thermal radiator comprises a resistor and said second thermal radiator comprises a resistor.

8. The method of claim 6 wherein said first thermal sensor (103) comprises a first thermistor and wherein said second thermal sensor (113) comprises a second thermistor.

9. The method of claim 7 wherein said output signal varies proportionally with respect to the power produced by said input signal.

10. The method of claim 9 wherein said output signal is the amplified difference of said reference signal minus said feedback signal.

* * * * *